US009111972B2

(12) United States Patent
Takeshita et al.

(10) Patent No.: US 9,111,972 B2
(45) Date of Patent: Aug. 18, 2015

(54) SUBSTRATE PROCESSING APPARATUS AND MANUFACTURING METHOD FOR A SEMICONDUCTOR DEVICE

(75) Inventors: Mitsunori Takeshita, Toyama (JP); Tomoyuki Matsuda, Toyama (JP); Mitsuhiro Hirano, Toyama (JP); Akihiro Sato, Toyama (JP); Shinya Morita, Toyama (JP); Toshimitsu Miyata, Toyama (JP); Koji Shibata, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 2169 days.

(21) Appl. No.: 10/593,282

(22) PCT Filed: Jun. 27, 2005

(86) PCT No.: PCT/JP2005/011714
§ 371 (c)(1),
(2), (4) Date: Apr. 22, 2008

(87) PCT Pub. No.: WO2006/006377
PCT Pub. Date: Jan. 19, 2006

(65) Prior Publication Data
US 2008/0236488 A1    Oct. 2, 2008

(30) Foreign Application Priority Data
Jul. 13, 2004    (JP) .................. 2004-205577

(51) Int. Cl.
*C23C 16/44*    (2006.01)
*H01L 21/469*    (2006.01)
(Continued)

(52) U.S. Cl.
CPC ...... *H01L 21/67303* (2013.01); *C23C 16/4401* (2013.01); *C23C 16/54* (2013.01); *H01L 21/6773* (2013.01); *H01L 21/67196* (2013.01); *H01L 21/67201* (2013.01)

(58) Field of Classification Search
CPC .............. H01L 21/67303; H01L 21/6773; H01L 21/67196; H01L 21/67201
USPC ........................................... 118/719
See application file for complete search history.

(56) References Cited

U.S. PATENT DOCUMENTS

| 5,277,579 A | * | 1/1994 | Takanabe .................. 432/5 |
| 6,143,040 A | * | 11/2000 | Tometsuka et al. .......... 29/25.01 |
| 2002/0197145 A1 | * | 12/2002 | Yamamoto et al. ........... 414/806 |

FOREIGN PATENT DOCUMENTS

| JP | 7-130721 | 5/1995 |
| JP | 7-297257 | 11/1995 |

(Continued)

OTHER PUBLICATIONS

Office Action dated Oct. 27, 2009 issued regarding Japanese Patent Application No. 2006-528655 with English translation.
(Continued)

*Primary Examiner* — Parviz Hassanzadeh
*Assistant Examiner* — Nathan K Ford
(74) *Attorney, Agent, or Firm* — Kratz, Quintos & Hanson, LLP

(57) ABSTRACT

The sizes required for maintenance are reduced and an occupying floor area is reduced. The substrate processing apparatus contains a load lock chamber 41 and a transfer chamber 24 respectively provided in order from the rear side within a case 11; and a processing chamber 53 provided above the load lock chamber 41 for processing wafers 1. An opening section 27A, and an opening and closing means 28A for opening and closing the opening section 27A are respectively provided in a location at the rear side of the transfer chamber 24 where the load lock chamber 41 is not arranged.

17 Claims, 4 Drawing Sheets

(51) Int. Cl.
*H01L 21/673* (2006.01)
*H01L 21/677* (2006.01)
*C23C 16/54* (2006.01)
*H01L 21/67* (2006.01)

(56) References Cited

FOREIGN PATENT DOCUMENTS

| JP | 09-107015 | 4/1997 |
|---|---|---|
| JP | 10-242232 | 9/1998 |
| JP | 2001-291673 | 10/2001 |
| JP | 2002-246445 | 8/2002 |
| JP | 2003-007800 | 1/2003 |
| JP | 2003-7800 | 1/2003 |
| JP | 2003-077974 | 3/2003 |
| JP | 2003-92329 | 3/2003 |
| JP | 2004-96075 | 3/2004 |

OTHER PUBLICATIONS

Office Action dated Apr. 14, 2009 corresponding to Japan patent application No. 2006-528655 with English translation.

* cited by examiner

SUBSTRATE PROCESSING APPARATUS AND MANUFACTURING METHOD FOR A SEMICONDUCTOR DEVICE

RELATED APPLICATIONS

This application is the U.S. National Phase under 35 U.S.C. 371 of International Application No. PCT/JP2005/011714, filed on Jun. 27, 2005, which in turn claims the benefit of Japanese Application No. 2004-205577, filed on Jul. 13, 2004, the disclosures of which are incorporated by reference herein.

TECHNICAL FIELD

The present invention relates to a substrate processing apparatus and a manufacturing method for semiconductor devices, and for example, is effective for utilization in dispersing impurities into the semiconductor wafer (hereafter called, wafer) where the IC is formed and forming a CVD film such as an insulating film or metallic film on the wafer in a manufacturing method for semiconductor integrated circuit devices (hereafter called ICs).

BACKGROUND ART

In a factory for implementing the IC manufacturing method (hereafter called, IC manufacturing factory), the external dimensions (foot print) of the substrate processing apparatus and in particular the width of the substrate processing apparatus must usually be kept small in order to install and array many substrate processing apparatus within the clean room.

In order to restrict the foot print by installing multiple substrate processing apparatus to the side and adjacent to each other in the IC manufacturing factory, the IC manufacturing factory must be designed so that maintenance (service and inspection tasks) of the substrate processing apparatus is not performed from the side (side-maintenance-free).

However, a natural oxide film that might be formed on the wafer is a factor in causing lower quality and reliability of the product (IC) as well as a drop in the production yield in the IC manufacturing method.

As substrate processing apparatus of this type of the prior art, the substrate processing apparatus using the load lock system (a system where the processing chamber and the carry-in/out chamber (standby chamber) are separated using a separator valve such as a gate valve, the inflow of air to the processing chamber is prevented, and the process is stabilized by reducing external disturbances such as pressure and temperature.) has been developed.

Substrate processing apparatus using the load lock system of the prior art to meet the above needs is the substrate processing apparatus of the type described next (See for example, patent document 1.).

The carry-in/out chamber (hereafter called the load lock chamber) and the transfer chamber separated from the processing chamber by the gate valve, are provided in order within the case from the rear side. A door valve for maintenance is installed on the rear side of the load lock chamber and a wafer-carry gate valve is installed on the front side of the load lock chamber. The valve opening of the gate valve is set to a size large enough to allow a person to pass through and all maintenance tasks can be performed from the front side or the rear side.

Patent Document 1: Japanese Patent Non-examined Publication No. 2000-269299

DISCLOSURE OF INVENTION

Problem to be Solved by the Invention

However, these type of substrate processing apparatus have the problems that not only is the drive device for the gate valve large due to the large gate valve installed in the front side of the load lock chamber but also the generation of particles is unavoidable due to friction and to expansion of the seal area.

The present invention therefore has the object of providing a substrate processing apparatus capable of avoiding the enlargement of the gate valve, reducing the required size for maintenance, and reducing the foot print.

Means for Solving the Problem

Typical means for resolving the aforementioned problems are described next.

(1) A substrate processing apparatus is characterized in that a load lock chamber and a transfer chamber are provided in order from the rear side within a case, and an opening section, and an opening and closing means for opening and closing the opening section, are provided in a location at the rear side of the transfer chamber where the load lock chamber is not arranged.

(2) A substrate processing apparatus according to (1) is characterized in that the opening section is provided for maintenance within the transfer chamber.

(3) A substrate processing apparatus according to (1) or (2) is characterized in that the opening section is set to a size to allow passage of a person.

(4) A substrate processing apparatus according to (1), (2) or (3) is characterized in that the opening and closing means faces the exterior of the case.

(5) A substrate processing apparatus is characterized in that a load lock chamber, and a transfer chamber where a substrate transfer device for transferring a substrate is installed, are provided in order from the rear side within a case, and an opening section for maintenance of the substrate transfer device, and an opening and closing means for opening and closing the opening section are provided in a location at the rear side of the transfer chamber where the load lock chamber is not arranged.

(6) A substrate processing apparatus is characterized in that a standby chamber for supporting a substrate in a substrate support jig and keeping the substrate in standby, a transfer chamber, and a carrier load means for loading a carrier storing the substrate are provided in order from the rear side within a case; and a line segment joining the center of the substrate supported in the substrate support jig, with the center of the substrate on the carrier loaded in the carrier load means is offset to one side along the width with respect to the center line passing through the center of the case width; and an opening section and an opening and closing means for opening and closing the opening section are provided at the front side or the rear side of the transfer chamber on the other side that is not offset.

(7) A substrate processing apparatus according to (6) is characterized in that a substrate transfer device for transferring the substrate is installed on one side within the transfer chamber, and a substrate aligner device for aligning the substrate is installed on the other side.

(8) A substrate processing apparatus according to (6) or (7) is characterized in that the rotation center in the horizontal plane of the substrate transfer device is positioned at the line segment.

(9) A substrate processing apparatus according to (6) is characterized in that the opening section is provided for maintenance within the transfer chamber.

(10) A substrate processing apparatus according to any one of (6) through (9) is characterized in that the opening section is provided for maintenance of the substrate transfer device and the substrate aligner device.

(11) A substrate processing apparatus according to any one of (6) through (10) is characterized in that the opening section is set to a size to allow passage of a person.

(12) A substrate processing apparatus according to any one of (6) through (11) is characterized in that the standby chamber is a load lock chamber.

(13) A substrate processing apparatus characterized in that a standby chamber and a transfer chamber are provided in order from the rear side within a case; and a cleaning unit for cleaning the atmosphere of the transfer chamber, a substrate aligner device for aligning a substrate, and a substrate transfer device for transferring the substrate are provided in the transfer chamber in sequence along the flow direction of the atmosphere blown out of the cleaning unit.

(14) A substrate processing apparatus according to (13) is characterized in that an opening section and an opening and closing means for opening and closing the opening section are provided in the vicinity of the cleaning unit at the front side or the rear side of the transfer chamber.

(15) A substrate processing apparatus according to (13) or (14) is characterized in that the opening section is provided for maintenance within the transfer chamber.

(16) A substrate processing apparatus according to any one of (13) through (15) is characterized in that the opening section is provided for maintenance of the substrate transfer device and the substrate aligner device.

(17) A substrate processing apparatus according to any one of (13) through (16) is characterized in that the opening section is set to a size to allow passage of a person.

(18) A substrate processing apparatus according to any one of (13) through (17) is characterized in that the standby chamber is a load lock chamber.

(19) A substrate processing apparatus according to any one of (1) through (5) and (12) is characterized in that the processing chamber for processing the substrate is provided above the load lock chamber.

(20) A substrate processing apparatus according to any one of (6) through (11), and (13) through (17) is characterized in that the processing chamber for processing the substrate is provided above the standby chamber.

(21) A substrate processing apparatus according to (19) or (20) is characterized in that a furnace opening gate valve cover for enclosing a furnace opening gate valve for opening and closing the processing chamber, is formed protruding at the front side further than the processing chamber; and an opening section for maintenance of the furnace opening gate valve cover, and an opening and closing means for opening and closing the opening section are provided above the transfer chamber.

(22) A substrate processing apparatus according to any one of (1) through (21) is characterized in that the opening section and the opening and closing means are provided so that the space of the transfer chamber gradually becomes smaller as seen along the horizontal direction, the closer the opening section and the opening and closing means are to the cleaning unit side.

(23) A substrate processing apparatus is characterized in that a load lock chamber and a transfer chamber are provided in order from the rear side within a case, a processing chamber is provided above the load lock chamber for processing a substrate, a heater unit for heating the processing chamber is provided, a gas supply pipe for supplying gas to the processing chamber is provided, an exhaust pipe for exhausting the processing chamber is provided, and an opening section and an opening and closing means for opening and closing the opening section are provided in a location at the rear side of the transfer chamber where the load lock chamber is not arranged.

(24) A manufacturing method for a semiconductor device for processing a substrate by utilizing a substrate processing apparatus comprising a load lock chamber and a transfer chamber provided in order from the rear side within a case, a processing chamber provided above the load lock chamber for processing a substrate, a heater unit for heating the processing chamber, a gas supply pipe for supplying gas to the processing chamber, an exhaust pipe for exhausting the processing chamber, and an opening section and an opening and closing means for opening and closing the opening section provided in a location at the rear side of the transfer chamber where the load lock chamber is not arranged, wherein the manufacturing method is characterized in comprising the steps of:

heating the processing chamber by the heater unit;

supplying gas from the gas supply pipe to the processing chamber;

processing the substrate; and exhausting the processing chamber through the exhaust pipe.

(25) A substrate processing apparatus is characterized in that a load lock chamber and a transfer chamber are provided in order from the rear side within a case, and the load lock chamber is offset to one side along the width with respect to the center line passing through the center of the case width; and an opening section, and an opening and closing means for opening and closing the opening section are provided at the rear side of the transfer chamber on the side opposite to the offset side.

(26) A substrate processing apparatus according to (25) characterized in that the opening section, and the opening and closing means for opening and closing the opening section are provided at the rear side of the load lock chamber.

Effect of the Invention

According to the above-mentioned (1), the task of maintaining the transfer chamber can be implemented via the opening section provided in a location at the rear side of the transfer chamber where the load lock chamber is not arranged, so that the passage section for allowing the worker to enter and leave and the maintenance area required on the side of the transfer chamber in installing a maintenance door on the side surface of the transfer chamber can be eliminated.

The foot print of the substrate processing apparatus can therefore be reduced. Moreover, the gate valve for the load lock chamber need not be made to a large size.

BEST MODE FOR CARRYING OUT THE INVENTION

An embodiment of the present invention is described next while referring to the accompanying drawings.

In this embodiment, the substrate processing apparatus of this invention is a batch vertical hot wall decompression CVD apparatus (hereafter called batch type CVD apparatus) used in the process of forming a CVD film such as metal film or insulating film on the wafer in the IC manufacturing method.

A batch type CVD apparatus 10 of this embodiment utilizes a FOUP (front opening unified pod, hereafter, called pod) 2 as the carrier that stores and transports wafers 1.

Figure 1:
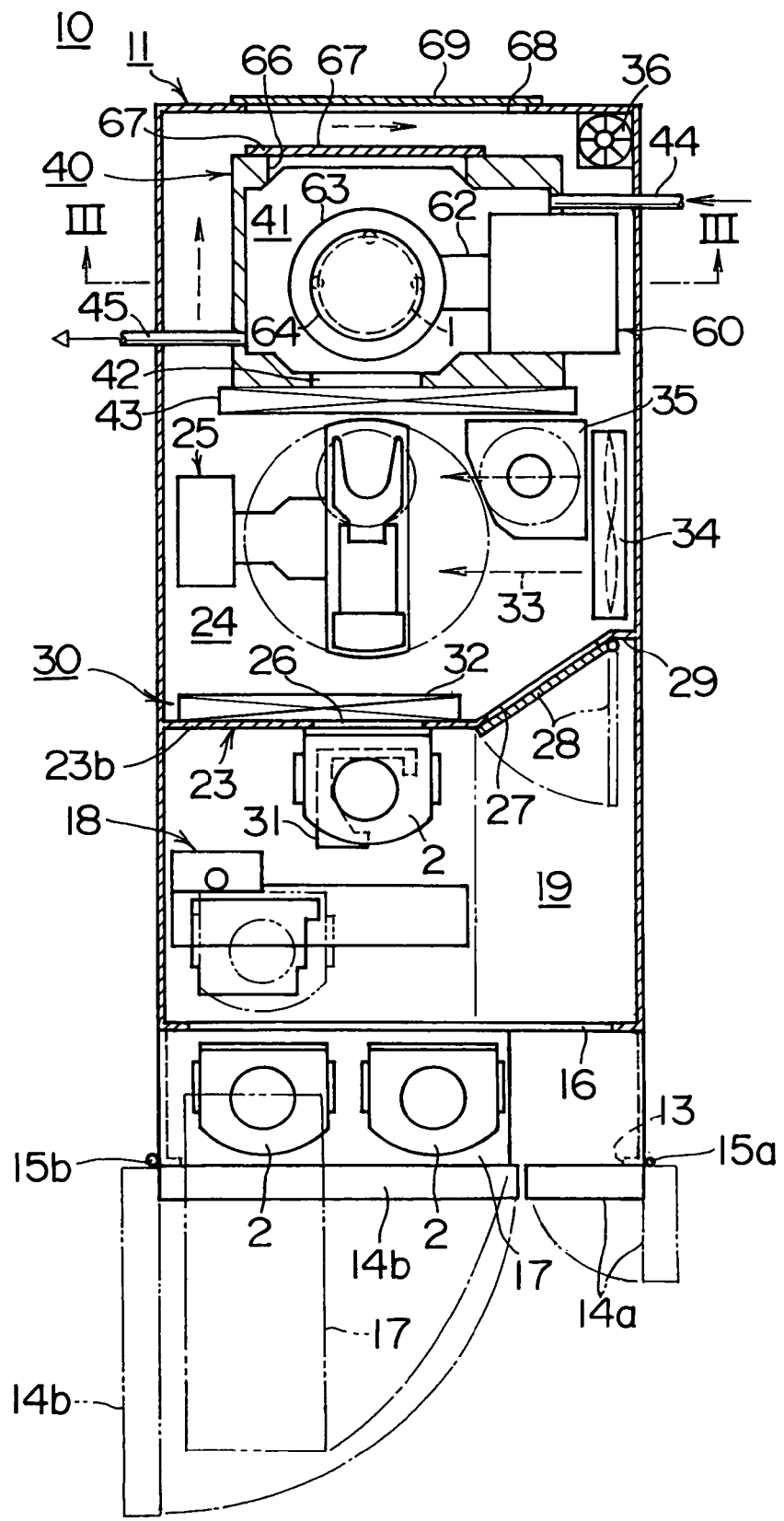
FIG. 1 is a cross sectional plan view showing the batch type CVD apparatus of the first embodiment of this invention.

In the following description, the front, rear, and left, right of FIG. 1 are used as a reference. In other words, a transfer chamber 24 side is the front side, a load lock chamber 41 side is the rear side, a boat elevator 60 side is the right side, and a seal cap 63 side is the left side.

Figure 2:
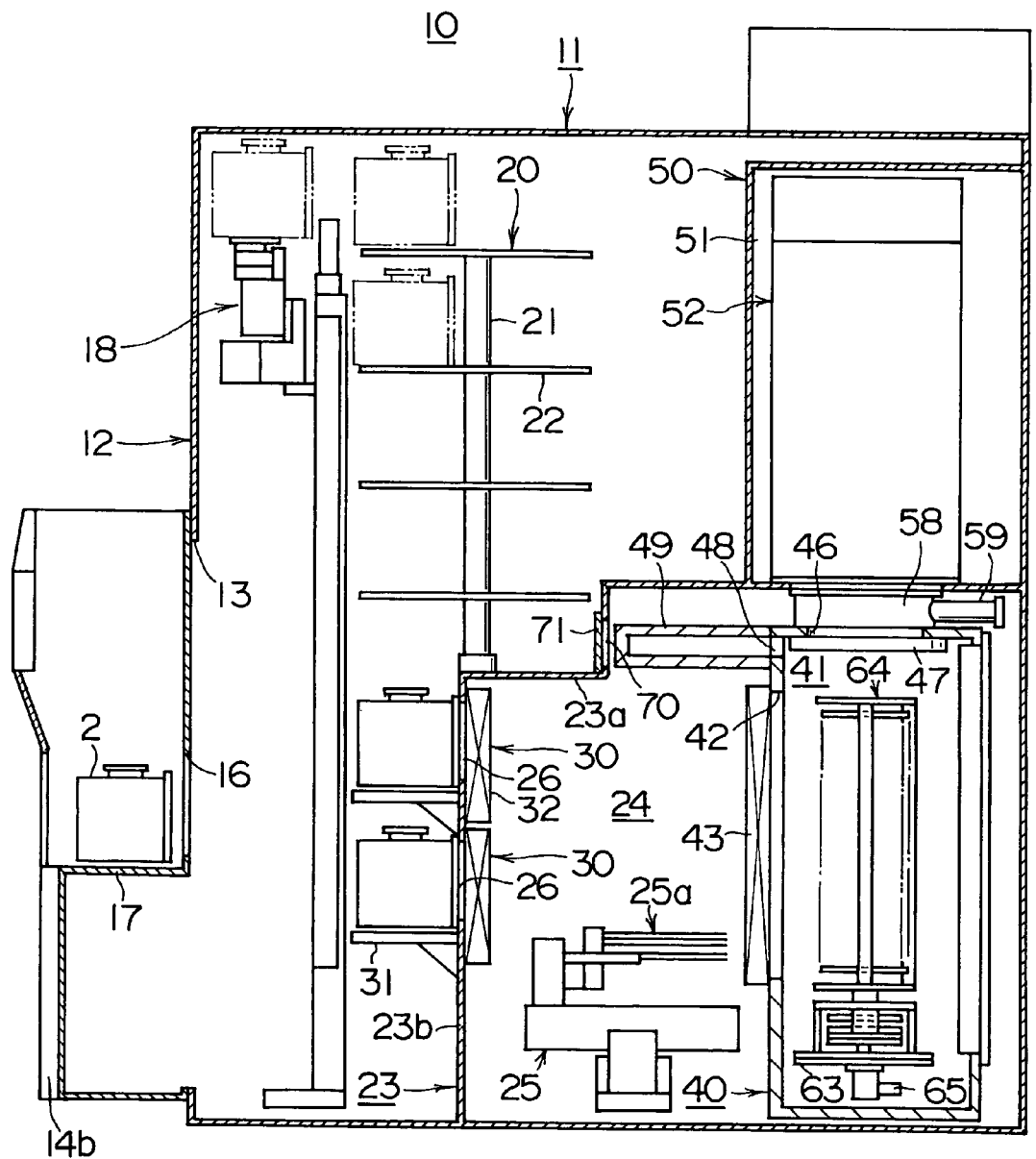
FIG. 2 is a cross sectional side view.

The batch type CVD apparatus 10 as shown in FIG. 1 and FIG. 2 includes a case 11 constructed in the shape of a right-angled parallelepiped. The case 11 is constructed airtight so as to be capable of maintaining atmospheric pressure.

A front maintenance opening 13 is set as an opening section in the lower section of a front wall 12 of the case 11 to a size allowing passage of a person. A first front maintenance door 14a and a second front maintenance door 14b are respectively constructed on the front side of the front wall 12 as an opening and closing means for opening and closing the front side of the front maintenance opening 13.

In other words, the right edge of the first front maintenance door 14a is supported by a hinge 15a on the right end of the front side of the front wall 12 to allow free rotation. The left edge of the second front maintenance door 14b is supported by a hinge 15b on the left end of the front side of the front wall 12 to allow free rotation. The first front maintenance door 14a opens by swiveling counterclockwise centering on the hinge 15a. The second front maintenance door 14b opens by swiveling clockwise centering on the hinge 15b (See imaginary line in FIG. 1.).

A pod carry-in/out opening 16 is formed at the middle height of the front wall 12. A pod stage 17 is constructed in front of the pod carry-in/out opening 16 of the front wall 12. The pod stage 17 is constructed to swivel clockwise as shown by the imaginary line in FIG. 1.

The pod 2 in the pod stage 17 is supplied and discharged by an in-process transport device such as an RGV.

A pod transfer device 18 is installed on the rear side of the front wall 12 of the case 11. The pod transfer device 18 is made up of a linear actuator and elevator and a SCARA type robot, etc.

The pod transfer device 18 is installed offset to the left side in the space on the front side of the case 11. Offsetting the pod transfer device 18 to the left side in this way, allows forming a maintenance passage 19 on the right section of the space on the front side of the case 11.

The pod transfer device 18 is constructed to transfer the pod 2 among the pod stage 17 and a swivel pod shelf 20 and a load mount 31 of a pod opener 30.

The swivel pod shelf 20 as shown in FIG. 2, is installed on the upper rear side of the pod transfer device 18 within the case 11, and is constructed to permit temporary storage of the multiple pods 2. In other words, the swivel pod shelf 20 contains a swiveling support rod 21, and a multiple shelf plates 22 for supporting the multiple pods 2. The multiple shelf plates 22 are arranged at multiple stage in the support rod 21 and are clamped horizontally.

A transfer chamber case unit 23 is installed on the lower side of the swivel pod shelf 20 in the case 11. The swivel pod shelf 20 is installed perpendicularly on a ceiling wall 23a of the transfer chamber case unit 23. The transfer chamber case unit 23 constitutes the transfer chamber 24 isolated from the space where the swivel pod shelf 20 and the pod transfer device 18 are installed.

A wafer transfer device 25 for transferring the wafers 1 is installed horizontally in the transfer chamber 24. The wafer transfer device 25 is constructed by a SCARA robot (selective compliance assembly robot arm). The wafer transfer device 25 is constructed to scoop up the wafers 1 with a tweezers 25a and transfer them in three dimensional directions.

A pair of upper and lower wafer carry-in/out openings 26, 26, and a transfer chamber maintenance opening 27, are respectively formed adjoining each other on the left and right in a front wall 23b of the transfer chamber case unit 23. The front wall 23b is bent on the right edge farther inwards at a section of the transfer chamber maintenance opening 27.

The upper and lower wafer carry-in/out openings 26, 26 are arranged offset to the left side. The upper and lower wafer carry-in/out openings 26, 26 are constructed so that the wafers 1 are carried in and out of the transfer chamber 24. The transfer chamber maintenance opening 27 is arranged on the right side section opposite to the offset. The transfer chamber maintenance opening 27 is formed to a size that permits a person to pass through. The transfer chamber maintenance opening 27 connects to a maintenance passage 19.

A transfer chamber maintenance door 28 is constructed as an opening and closing means to open and close the transfer chamber maintenance opening 27 in the front wall 23b. In other words, the right side edge of the transfer chamber maintenance door 28 is supported by a hinge 29 on the right edge of the front wall 23b to allow free swiveling. The transfer chamber maintenance door 28 opens while swiveling counterclockwise centering on the hinge 29 (See the Imaginary Line in FIG. 1.)

The transfer chamber maintenance door 28 also maintains sufficient air-tight when closed, and adequately separates the transfer chamber 24 from the maintenance passage 19 side.

The upper and lower pair of pod openers 30, 30 are installed in the pair of upper and lower wafer carry-in/out openings 26, 26 on the front wall 23b of the transfer chamber case unit 23.

The pod opener 30 contains the load mount 31 on which the pod 2 is loaded and arranged protruding horizontally on the bottom edge of the front side of the wafer carry-in/out openings 26; and contains a cap installation and removal mechanism 32 to install or remove the cap of the pod 2 mounted on the load mount 31. Installing and removing the cap of the pod 2 mounted on the load mount 31 with the cap installation and removal mechanism 32 allows opening and closing the wafer carry-in/out opening of the pod 2.

As shown in FIG. 1, a cleaning unit 34 for blowing clean air 33 is installed on the right side end opposite to the wafer transfer device 25 of the transfer chamber 24. A notch aligner device 35 functioning as the substrate aligner device is installed between the wafer transfer device 25 and the cleaning unit 34.

After the clean air 33 blown from the cleaning unit 34 passes through the notch aligner device 35 and wafer transfer device 25, it is suctioned into an exhaust device 36 installed in the right rear corner of the case 11 and exhausted outside of the case 11.

After air blow from the cleaning unit 34, it flows through the notch aligner device 35 and the wafer transfer device 25 while supplying nitrogen gas by a nitrogen gas supply means not shown in the drawing, and then it is suctioned into the duct not shown in the drawing on the left side of the wafer transfer device 25 and may be exhausted to outside the case 11.

A case unit (hereafter called pressure-resistant case) 40 capable of maintaining a gas-sealed state at a pressure less than atmospheric pressure (hereafter called negative pressure) is installed on the rear side of the transfer chamber 24 within the case 11. The load lock chamber 41 serving as a standby chamber with a load lock system and capable of storing the boat, is formed by this pressure-resistant case 40.

A wafer carry-in/out opening 42 is formed on the front wall of the pressure-resistant case 40. A gate valve 43 opens and closes the wafer carry-in/out opening 42. A gas supply pipe 44 for supplying nitrogen ($N_2$) gas to the load lock chamber 41; and an exhaust pipe 45 for exhausting the load lock chamber 41 to a negative pressure are respectively connected to the pair of side walls on the pressure-resistant case 40.

Figure 3:
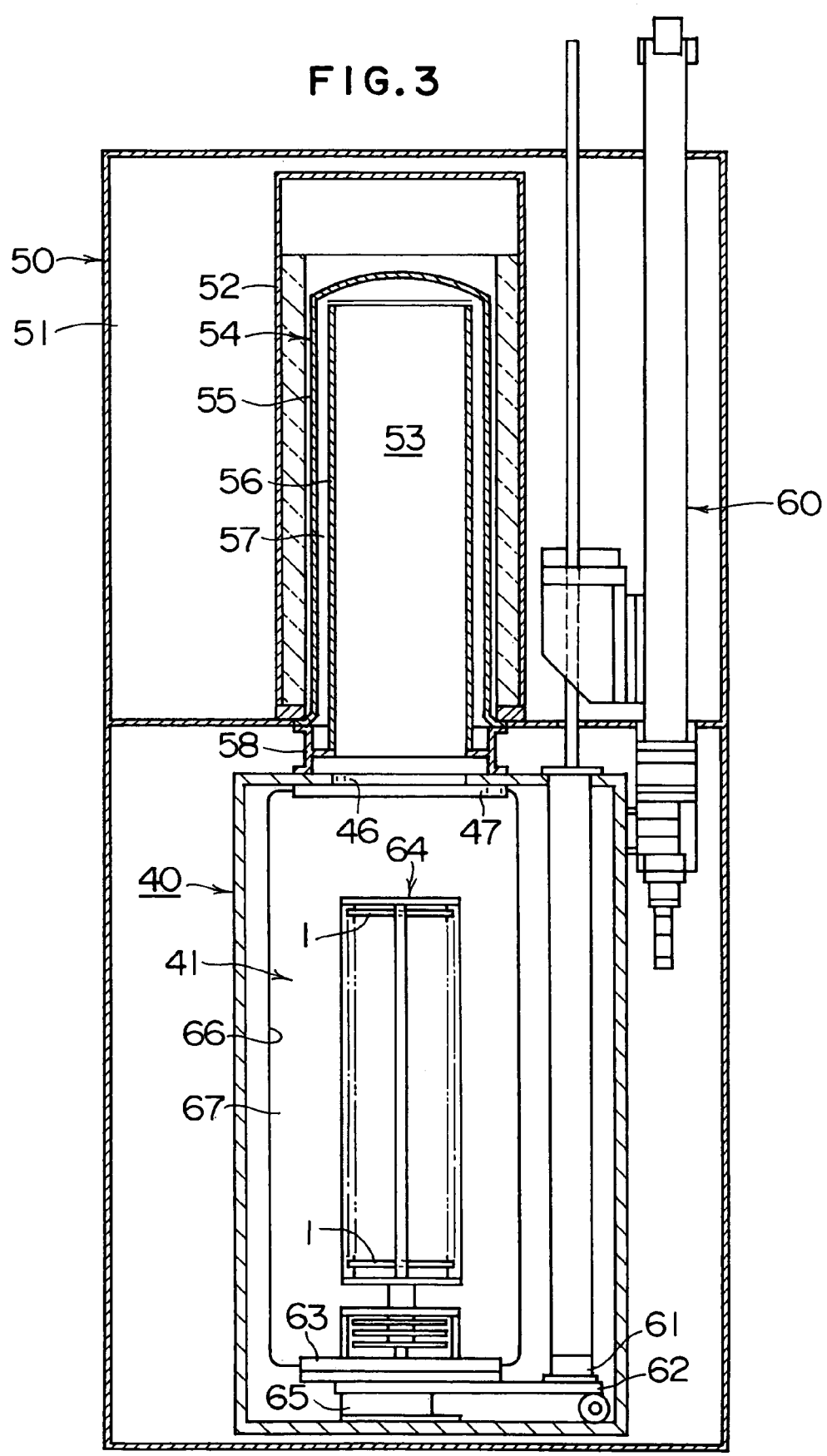
FIG. 3 is a cross sectional view taken along lines III-III of FIG. 1.

A boat load-in/out opening 46 is formed on the ceiling wall of the load lock chamber 41 as shown in FIG. 2 and FIG. 3. The boat load-in/out opening 46 is structured to be opened and closed by a furnace opening gate valve 47 formed in a disk shape with a larger diameter than the boat load-in/out opening 46.

A furnace gate valve in/out opening 48 on the upper edge of the front wall of the pressure-resistant case 40 is formed in an oblong, rectangular shape larger than the thickness and diameter of the furnace opening gate valve 47. A furnace opening gate valve cover 49 for storing the furnace opening gate valve 47 when the boat load-in/out opening 46 is opened, is installed on the outer side of the front wall of the pressure-resistant case 40 so as to close the furnace gate valve in/out opening 48.

The furnace opening gate valve cover 49 has a case shape formed in a semicircular shape with a volume whose thickness and lateral width is larger than the height and opening of the furnace gate valve in/out opening 48; and the side wall equivalent to the hypotenuse of the semicircular shape has an opening section. The right edge of the side wall with an opening section on the furnace opening gate valve cover 49 is supported to allow swiveling horizontally by a hinge (not shown in drawing) installed on one end of the furnace gate valve in/out opening 48.

The furnace opening gate valve cover 49 is tightened via a sealing ring in direct contact with the front surface of the pressure-resistant case 40 by a tightening piece when the furnace gate valve in/out opening 48 is normally closed. The furnace opening gate valve cover 49 is in a state extruded forwards from the front side of the pressure-resistant case 40.

A heater unit case 50 is constructed above the pressure-resistant case 40. A heater unit 52 for heating a processing chamber 53 is installed perpendicularly in a heater unit chamber 51 of the heater unit case 50.

As can be seen in FIG. 3, a process tube 54 forming the processing chamber 53 is installed in the interior of the heater unit 52.

The process tube 54 is made up of an outer tube 55 made of quartz ($SiO_2$) and formed in a tubular shape with an opening section on the bottom side and sealed on the top side; and an inner tube 56 made of quartz or silicon carbide (SiC) and formed in a tubular shape with an opening section on the top side and bottom side. The outer tube 55 concentrically covers the inner tube 56.

A ring shaped exhaust passage 57 is formed by the gap between the outer tube 55 and the inner tube 56. The process tube 54 is supported via a manifold 58 on the ceiling wall of the pressure-resistant case 40. The manifold 58 is installed concentrically with the boat load-in/out opening 46.

As shown in FIG. 2, the manifold 58 is connected to an exhaust pipe 59 for exhausting the interior of the process tube 54.

Though not shown in the drawing, the batch type CVD apparatus 10 includes gas feed pipes for feeding gas such as material gas and purge gas to the processing chamber 53, and a thermocouple to measure the temperature within the process tube 54 and for feedback control of the heater unit 52.

As shown in FIG. 1 and FIG. 3, the boat elevator 60 is installed in the pressure-resistant case 40 for raising and lowering the boat. The boat elevator 60 is made up of a feed-screw device or a bellows, etc.

An arm 62 is installed horizontally on the side surface of an up/down bed 61 of the boat elevator 60. The seal cap 63 is installed horizontally in the tip of the arm 62.

The seal cap 63 is constructed to hermetically seal the boat load-in/out opening 46 of the pressure-resistant case 40 that forms the furnace opening of the process tube 54.

A boat 64 is supported perpendicularly as a substrate support jig on the seal cap 63. The boat 64 supports multiple wafers (for example: 25 wafers, 50 wafers, 100 wafers, 125 wafers, 150 wafers) 1 arranged concentrically and horizontally, and is structured to perform load-in and load-out to the process chamber 53 of the process tube 54 along with the raising and lower of the seal cap 63 by the boat elevator 60.

The boat 64 is also constructed to rotated by a rotary actuator 65 installed on the seal cap 63.

As shown in FIG. 1, the boat 64 and the load mount 31 of the pod opener 30 are arranged so that the line segment joining the center of the wafers 1 supported in the boat 64, with the center of the wafers 1 of the pod 2 loaded on the load mount 31 of the pod opener 30, is offset to the left side along the width with respect to the center line passing through the center of the case 11 width.

The center of rotation on the horizontal plane of the wafer transfer device 25 is arranged on a line segment joining the center of the wafer 1 on the boat 64 with the center of the wafer 1 on the pod 2 on the pod opener 30.

A load lock chamber maintenance opening 66 is formed in a longitudinal rectangular shape on the rear wall of the pressure-resistant case 40. A maintenance door 67 for closing the load lock chamber maintenance opening 66 is installed on the outer side of the rear wall.

The maintenance door 67 is structured to seal the load lock chamber maintenance opening 66 in order to maintain a negative pressure.

A rear maintenance opening 68 is formed in a longitudinal rectangular shape on the rear wall of the case 11. A rear maintenance door 69 for closing the rear maintenance opening 68 is installed on the outer side of the rear wall.

A maintenance opening 70 is formed in the front of the furnace opening gate valve cover 49 on the ceiling wall 23a of the transfer chamber case unit 23 as an opening section for maintenance of the furnace opening gate valve cover 49. A maintenance door 71 is installed on the ceiling wall 23a as an opening and closing means for opening and closing the maintenance opening 70.

The process for forming the film in the IC manufacturing method using the batch type CVD apparatus of this embodiment is described next.

The description for this embodiment assumes the product wafers 1 of 25 pieces or less stored within the pod 2 to be batch processed.

The wafers 1 of 25 pieces or less for film forming and stored in the pod 2 are transported by the process transport device to the pod stage 17 of the batch type CVD apparatus 10.

The transported pod 2 is transferred from the pod stage 17 to the specified location of the swivel pod shelf 20 by the pod transfer device 18 and stored.

The pod 2 where the wafers 1 are stored, is transferred by the pod transfer device 18 onto the load mount 31 of the pod opener 30 and loaded. The cap for covering the wafer carry-in/out opening for transferring the wafers 1 into and outside the pod 2 is removed by the cap installation and removal mechanism 32 of the pod opener 30 to open the wafer carry-in/out opening of the pod 2.

When the pod 2 is opened by the pod opener 30, the wafer carry-in/out opening 42 of the load lock chamber 41 is opened by the gate valve 43. The load lock chamber 41 at this time is maintained in a so-called nitrogen gas purge atmosphere where it is filled with nitrogen gas, and maintained at approximately atmospheric pressure.

When the pod opener 30 opens the pod 2, the wafers 1 are picked up from the pod 2 by the wafer transfer device 25 via the wafer carry-in/out opening 26 and carried in to the transfer chamber 24.

The wafers 1 carried into the transfer chamber 24 are loaded onto the notch aligner device 35, picked up again by the wafer transfer device 25 after the notches of the wafers 1 are aligned by the notch aligner device 35, carried into the load lock chamber 41 via the wafer carry-in/out opening 42, and transferred to the boat 64 and charged (wafer charging).

By repeating this transfer process, all wafers 1 of the pod 2 are charged by the wafer transfer device 25 in the boat 64.

The now empty pod 2 is temporarily returned by the pod transfer device 18 from the load mount 31 of the pod opener 30 to the swivel pod shelf 20.

When the gate valve 43 closes the wafer carry-in/out opening 42, the load lock chamber 41 is decompressed by raising a vacuum via the exhaust pipe 45. At this time, the load lock chamber 41 is isolated from the transfer chamber 42 so that the decompression time can be kept short.

The furnace opening gate valve 47 opens the boat load-in/out opening 46 when the load lock chamber 41 is decompressed to the specified negative pressure. The furnace opening gate valve 47 is at this time carried into the furnace opening gate valve cover 49 from the furnace gate valve in/out opening 48 and is stored.

The seal cap 63 is next raised by the up/down bed 61 of the boat elevator 60, and then the boat 64 supported on the seal cap 63 is loaded into the processing chamber 53 of the process tube 54 (boat loading).

When the boat 64 reaches the upper limit, the periphery of the upper surface of the seal cap 63 supporting the boat 64 closes the boat load-in/out opening 46 in a sealed state, so that the processing chamber 53 is closed in a hermetically sealed state.

The load lock chamber 41 is maintained at a negative pressure during load-in of the boat 64 to the processing chamber 53 so that the intrusion of external moisture and oxygen into the processing chamber 53 is reliably prevented when the boat 64 is loaded into the processing chamber 53.

The processing chamber 53 of the process tube 54 is then exhausted in an air-tight state to the specified pressure via the exhaust pipe 59, and is heated by the heater unit 52 to the specified temperature, and the specified material gas of the specified flow is supplied via the gas feed pipe.

The specified film is in this way formed on the wafers 1 according to the pre-established process conditions.

When the processing time set for film forming step for the wafers 1 has elapsed, the boat 64 is lowered by the boat elevator 60 after replacement by nitrogen gas in the processing chamber 53, so that the boat 64 supporting the processed wafers 1 is loaded out to the load lock chamber 41 (boat unloading).

When the boat 64 is loaded out to the load lock chamber 41, the furnace opening gate valve 47 closes the boat load-in/out opening 46, and the load lock chamber 41 is subjected to nitrogen gas purging.

On the other side, the empty pod 2 is loaded out from the swivel pod shelf 20 by the pod transfer device 18 and transferred to the load mount 31 of the pod opener 30.

The gate valve 43 opens the wafer carry-in/out opening 42, when the pressure of the nitrogen gas purge atmosphere of the load lock chamber 41 is maintained at approximately atmospheric pressure. The cap on the empty pod 2 on the load mount 31 of the pod opener 30 is also opened by the cap installation and removal mechanism 32.

The processed wafers 1 on the loaded out boat 64 are next discharged by the wafer transfer device 25, and carried in to the transfer chamber 24 maintained at atmospheric pressure. The processed wafers 1 that were carried in, are then stored by the wafer transfer device 25 in the empty pod 2 of the pod opener 30.

When the processed wafers 1 on the boat 64 are stored in the pod 2, the cap is then attached to the pod 2 by the cap installation and removal mechanism 32 of the pod opener 30, and the pod 2 is then transferred from the load mount 31 to the swivel pod shelf 20 by the pod transfer device 18.

The pod 2 storing the processed wafers 1 is then transferred from the swivel pod shelf 20 to the pod stage 17, and the in-process transfer device then transfers it from the pod stage 17 to the next process.

The wafers 1 are from hereon batch processed 25 pieces each in the batch type CVD apparatus 10 by repeating the action described above.

However, if for example the ceramic tweezers 25a of the wafer transfer device 25 is damaged, then the tweezers 25a must be replaced.

As shown by the imaginary line in FIG. 1, when performing maintenance in the transfer chamber 24, the first front maintenance door 14a swivels horizontally forward centering on the hinge 15a so that the right side of the front maintenance opening 13 is opened.

Next, as shown by the imaginary line in FIG. 1, the transfer chamber maintenance door 28 swivels forward centering on the hinge 29 so that the transfer chamber maintenance opening 27 is opened.

The task of replacing the tweezers 25a of the wafer transfer device 25 in the transfer chamber 24 is then performed via the front maintenance opening 13, the maintenance passage 19 and the transfer chamber maintenance opening 27.

Maintenance tasks in the furnace opening gate valve cover 49 are performed via the front maintenance opening 13, the maintenance passage 19, and the maintenance opening 70 for the furnace opening gate valve cover.

When performing full cleaning (cleaning by wet etching), etc. of the boat 64 and the process tube 54, the rear maintenance opening 68 on the rear wall of the case 11 is opened by the maintenance door 69.

The maintenance door 67 next opens the load lock chamber maintenance opening 66 on the rear wall of the pressure-resistant case 40.

The task of replacing the boat 64 and the process tube 54 is then performed via the load lock chamber maintenance openings 66 and 68.

The embodiment described above yields the following effects.

1) Forming a transfer chamber maintenance opening on the front wall of the transfer chamber, and installing a maintenance door to open and close the transfer chamber maintenance opening allows performing maintenance tasks within the transfer chamber by way of the transfer chamber maintenance opening, so that the maintenance area required at the side of the transfer chamber when the maintenance door is installed on the side surface of the transfer chamber can be eliminated, and the passage section for allowing the worker to enter and leave can be eliminated. Consequently, the foot print of the batch type CVD apparatus can be reduced.

2) By offsetting the line segment joining the center of the wafer held in the boat with the center of the wafer of the pod loaded in the pod opener towards one side (left side) along the width with respect to the center line passing through the center of the width of the case, and by forming a transfer chamber maintenance opening that is opened and closed by the maintenance door on the side (right side) opposite to the front wall of the transfer chamber, unnecessary increases in the foot print can be eliminated even if the device is the batch type CVD apparatus in which the load lock chamber, the transfer chamber and the pod opener are installed in order from the rear side within the case. Moreover, maintenance of equipment such as the wafer transfer device and the notch aligner device installed inside the transfer chamber can be performed without having to pass through the load lock chamber so that these maintenance tasks can be easily performed.

3) There is also no need to expose the load lock chamber to the outer air when maintaining the transfer chamber so that contamination of the load lock chamber can be prevented during maintenance. Moreover, the size of the load lock chamber can be reduced since there is no need for using the load lock chamber as a passage way, and the time required for decompression and replacing the nitrogen gas can be shortened.

4) Utilizing a structure that opens and closes the front wall of the case allows easily performing maintenance such as for the pod transfer device and the pod opener, and also can attain a passage way for access to the transfer chamber maintenance opening installed further inside.

5) Separating the front maintenance door along the width into two sections; with one side set to approximately the same width as the pod stage, and the other side set to approximately the same width as the maintenance passage, allows maintenance by opening just one side when performing maintenance of the transfer chamber and the furnace opening gate valve so that maintenance tasks can be performed more efficiently.

6) By installing the wafer transfer device and the notch aligner device and the cleaning unit in order along the direction of clean air flow in the transfer chamber, the wafer transfer device and the notch aligner device can be effectively cleaned by the clean air so that the degree of purity of the wafer and the batch type CVD apparatus can be improved. In other words, when the wafer transfer device and the notch aligner device are compared, the wafer transfer device has larger movement so that particles often are generated and blown up and therefore installing the wafer transfer device downstream as seen from the cleaning unit renders more effective cleaning due to the clean air.

7) Providing the transfer chamber maintenance opening and the transfer chamber maintenance door so that the transfer chamber space becomes gradually smaller the closer they are to the cleaning unit side as viewed horizontally, allows limiting the space (volume) for cleaning to a small space, and also prevents clean air blown from the cleaning unit from accumulating in one location and permits the clean air to diffuse to the entire transfer chamber so that the cleaning effect obtained from the clean air can be improved.

8) Providing the transfer chamber maintenance opening in the vicinity of the cleaning unit allows easily performing maintenance of the cleaning unit.

9) Installing the furnace opening gate valve cover to enclose the furnace opening gate valve for opening and closing the processing chamber above the transfer chamber, and installing a maintenance door and maintenance opening for maintenance of the furnace opening gate valve cover above the transfer chamber, allows performing maintenance tasks on the furnace opening gate valve cover and the furnace opening gate valve without having to pass through the transfer chamber and the load lock chamber.

Figure 4:
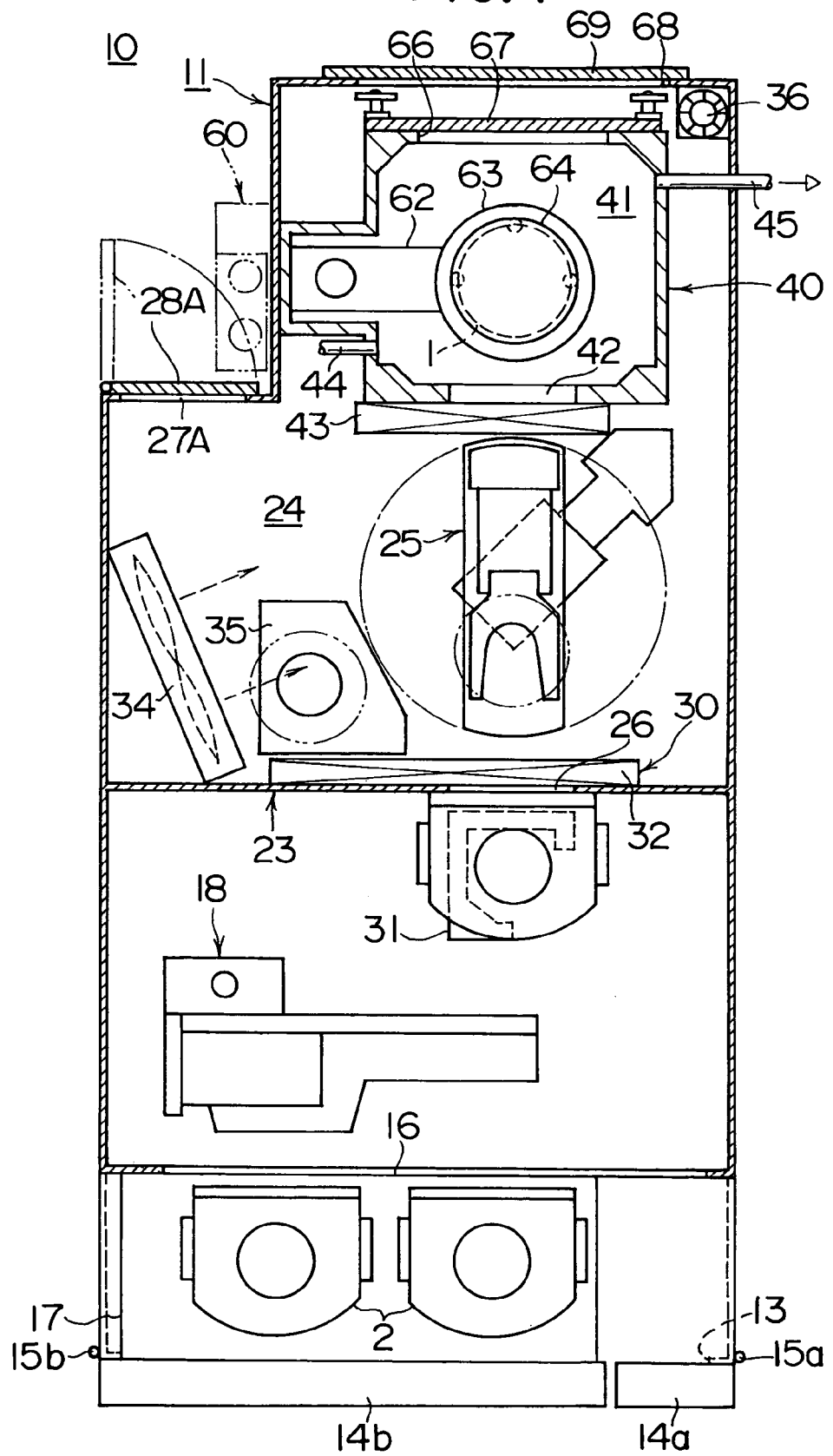
FIG. 4 is a cross sectional plan view showing the batch type CVD apparatus of the second embodiment of this invention.

FIG. 4 is a cross sectional plan view showing the batch type CVD apparatus of another embodiment of the present invention.

The point where the present embodiment differs from the previous embodiment is that the line segment along the center of the wafer 1 on the pod opener 30 and the center of the wafer on the wafer transfer device 25 and the center of the wafer 1 on the boat 64 is offset to the right side with respect to the center line passing through the center of the width of the case 11. This embodiment also differs in the point that the transfer chamber maintenance opening 27A and the transfer chamber maintenance door 28A are provided facing the outer section on the left edge of the rear wall of the transfer chamber 24.

The present embodiment also yields the same effect as the first embodiment since there is direct access to the transfer chamber 24 via the transfer chamber maintenance opening 27A.

The present invention is not limited by the above described embodiments and variations and adaptations not departing from the intent and the scope of the invention are allowed.

The opening and closing means for opening and closing the maintenance opening serving as the opening section for example, is not limited to a door and may be constructed as a cover, etc.

The location for installing the pod opener and the location for forming the transfer chamber maintenance opening are on the same surface as shown in FIG. 1, but may be shifted up and down.

The standby chamber for keeping the boat in standby is not necessarily comprised by the load lock chamber and may be comprised by an air-tight chamber capable of maintaining atmospheric pressure.

The gate valve for opening and closing the wafer carry-in/out opening of the pressure-resistant case, wafer transfer device and notch aligner device installed in the transfer chamber can be installed and removed. When replacing them or performing maintenance outside the transfer chamber, the transfer chamber maintenance opening and the transfer chamber maintenance door made to a size allowing the gate valve, wafer transfer device and notch aligner device, etc. to be removed and brought outside the transfer chamber via the transfer chamber maintenance opening make the maintenance work easier.

The above embodiments describe a batch type CVD apparatus, however the present invention is not limited to this apparatus and may be applied to general substrate processing apparatus.

The invention claimed is:

1. A substrate processing apparatus comprising a load lock chamber, a transfer chamber and a maintenance passage provided in order along a length direction from the rear side within a case having a maintenance opening for entry of maintenance personnel into the maintenance passage from outside the case, and a processing chamber provided above the load lock chamber for processing a substrate, wherein an opening section, arranged in a wall isolating the maintenance passage from the transfer chamber to form an air-tight seal, for entry of maintenance personnel into the transfer chamber from the maintenance passage of the case, and a door for opening and closing the opening section are provided in a location along the length direction at a front side of the transfer chamber.

2. A substrate processing apparatus according to claim 1, wherein the transfer chamber has a length and width with the length being the dimension between the front and rear sides and a cleaning unit for cleaning the atmosphere of the transfer chamber is installed in the transfer chamber at a cleaning unit side in the width direction, and the opening section and the door are positioned so that the length of the transfer chamber gradually decreases along the Width direction closer to the cleaning unit side.

3. A substrate processing apparatus according to claim 1, wherein the load lock chamber and the transfer chamber are provided in order from the rear side within the case, the load lock chamber is offset to one side along the Width direction with respect to the center line passing through the center of the case Width; and the opening section, and the door for opening and closing the opening section are provided at the rear side of the transfer chamber on the side opposite to the offset side.

4. A substrate processing apparatus according to claim 3, wherein the opening section, the door for opening and closing the opening section are provided at the rear side of the load lock chamber.

5. A substrate processing apparatus according to claim 1, wherein the case is constructed so as to be capable of maintaining atmospheric pressure.

6. A substrate processing apparatus according to claim 1, wherein the opening section arranged for entry of maintenance personnel inclines to the side Wall of the case.

7. A substrate processing apparatus according to claim 1; wherein the maintenance passage is provided in front of the opening section arranged for entry of maintenance personnel.

8. A substrate processing apparatus comprising a standby chamber for supporting a substrate in a substrate support jig and maintaining the substrate in standby, a transfer chamber, and a chamber housing a carrier load mount for loading a carrier storing the substrate, which are provided in order along a length direction from the rear side within a case having a maintenance opening for entry of maintenance personnel into the chamber housing the carrier load mount from outside the case, and a processing chamber provided above the standby chamber for processing the substrate, wherein the line segment joining the center of the substrate supported in the substrate support jig, with the center of the substrate on the carrier loaded in the carrier load mount, when at rest position, is offset to an offset side along the width direction with respect to the center line passing through the center of the case width; and an opening section disposed in a wall isolating the transfer chamber from the chamber housing the carrier load mount to form an air-tight seal, and a door for opening and closing the opening section are provided at the front side of the transfer chamber on the side along the width direction which opposes the offset side along the width direction and for entry of maintenance personnel into the transfer chamber.

9. A substrate processing apparatus according to claim 8, wherein a substrate transfer device for transferring the substrate is installed on one side along the width direction in the transfer chamber, and a substrate aligner device for aligning the substrate installed on the other side along the width direction.

10. A substrate processing apparatus according to claim 9, wherein the rotation center in the horizontal plane of the substrate transfer device, when at rest position, is arranged on the line segment.

11. A substrate processing apparatus according to claim 9, wherein the opening section is arranged for entry of maintenance personnel into the transfer chamber, provided for maintenance of the substrate transfer device and the substrate aligner device.

12. A substrate processing apparatus according to claim 8, wherein a cleaning unit for cleaning the atmosphere of the transfer chamber, and a substrate aligner device for aligning the substrate, and a substrate transfer device for transferring the substrate are installed in sequence in the transfer chamber along the flow direction of the atmosphere blownout of the cleaning unit.

13. A substrate processing apparatus according to claim 12, wherein the opening section is arranged for entry of maintenance personnel into the transfer chamber, provided for maintenance of the substrate transfer device and the substrate aligner device.

14. A substrate processing apparatus according to claim 12, wherein the transfer chamber has a length and width with the length being the dimension between the front and rear sides and the cleaning unit is installed at a cleaning unit side in the width direction and the opening section and the door are positioned so that the length of the transfer chamber gradually decreases along the width direction closer to the cleaning unit side.

15. A substrate processing apparatus according to claim 8, wherein the standby chamber is a load lock chamber.

16. A substrate processing apparatus according to claim 8, wherein the transfer chamber has a length and width with the length being the dimension between the front and rear sides and a cleaning unit for cleaning the atmosphere of the transfer chamber is installed in the transfer chamber at a cleaning unit side in the width direction, and the opening section and the door are positioned so that the length of the transfer chamber gradually decreases along the Width direction closer to the cleaning unit side.

17. A manufacturing method for a semiconductor device for processing a substrate by utilizing a substrate processing apparatus comprising a load lock chamber, a transfer chamber and a maintenance passage provided in order along a length direction from the rear side within a case having a maintenance opening for entry of maintenance personnel into the maintenance passage from outside the case, a processing chamber provided above the load lock chamber for processing a substrate, and an opening section disposed in a wall isolating the transfer chamber from the maintenance passage of the case to form an air-tight seal, and a door for opening and closing the opening section provided in a location along the length direction at a front side of the transfer chamber and for entry maintenance personnel into the transfer chamber wherein the manufacturing method comprises the steps of: carrying the substrate into the load lock chamber from the transfer chamber whose door closes the opening section; carrying the substrate into the processing chamber from the depressurized load lock chamber; and processing the substrate.

* * * * *